United States Patent [19]

Inuzuka

[11] Patent Number: 4,789,641
[45] Date of Patent: Dec. 6, 1988

[54] METHOD OF MANUFACTURING AMORPHOUS PHOTOVOLTAIC-CELL MODULE

[75] Inventor: Takahiko Inuzuka, Amagasaki, Japan

[73] Assignee: Mitsubishi Denki Kabushiki Kaisha, Japan

[21] Appl. No.: 9,225

[22] Filed: Jan. 30, 1987

[30] Foreign Application Priority Data

Mar. 4, 1986 [JP] Japan .................................. 61-45391

[51] Int. Cl.⁴ .................................................. H01L 31/18
[52] U.S. Cl. ............................................ 437/4; 437/2; 437/51; 437/205; 136/244; 136/258
[58] Field of Search ....................... 437/2, 4, 51, 205; 136/244, 258 AM

[56] References Cited

U.S. PATENT DOCUMENTS

| | | | |
|---|---|---|---|
| 4,249,959 | 2/1981 | Jebens | 136/244 |
| 4,419,530 | 12/1983 | Nath | 136/251 |
| 4,443,652 | 4/1984 | Izu et al. | 136/251 |
| 4,514,579 | 4/1985 | Hanak | 136/249 |
| 4,525,594 | 6/1985 | Pschunder | 136/256 |
| 4,617,426 | 10/1986 | Nath et al. | 136/244 |

FOREIGN PATENT DOCUMENTS

| | | | |
|---|---|---|---|
| 58-194379 | 11/1983 | Japan | 136/251 |
| 60-211906 | 10/1985 | Japan | 136/244 |

OTHER PUBLICATIONS

Abstract X15 of U.S. Pat. No. 4,514,579.

Primary Examiner—Aaron Weisstuch
Attorney, Agent, or Firm—Leydig, Voit & Mayer

[57] ABSTRACT

In this invention a unitary amorphous photovoltaic cell is first formed, the unitary amorphous photovoltaic cell is subsequently cut into sections each including at least one digitated collector, thereby to form individual amorphous photovoltaic cells, and lastly the digitated collector of each individual amorphous photovoltaic cell and the exposed narrow portions of a lower electrode of the adjacent individual amorphous photovoltaic cell are connected in electrical series.

9 Claims, 3 Drawing Sheets

METHOD OF MANUFACTURING AMORPHOUS PHOTOVOLTAIC-CELL MODULE

BACKGROUND OF THE INVENTION

This invention relates to a method of manufacturing an amorphous photovoltaic-cell module. More particularly, it relates to a method of manufacturing an amorphous photovoltaic-cell module in which a large number of amorphous photovoltaic cells are formed on a lower electrode of large area and put into a module, thereby to reduce the cost of manufacture.

FIGS. 5(a) and 5(b) are a front view and a sectional view, respectively, showing a conventional metal substrate type amorphous photovoltaic cell of 10 cm×10 cm which is employed in an amorphous photovoltaic-cell module for, e.g., the generation of electric power. As seen from FIG. 5(b), the amorphous photovoltaic cell 1 is constructed of a metal substrate such as stainless steel substrate 2 which serves as a lower electrode, a PIN-junction diode 3 which is formed on the stainless steel substrate 2, a transparent upper electrode 4 which is formed on the PIN-junction diode 3, and collectors 5 which have a configuration as shown in FIG. 5(a). Such an amorphous photovoltaic cell 1 is produced using the stainless steel substrate 2 which has been cut into predetermined dimensions beforehand. Symbols 2a denote parts of the stainless steel substrate 2.

FIG. 6 is a view showing the arrangement and connection of the amorphous photovoltaic cells 1 in the power-generating amorphous photovoltaic-cell module which has been fabricated using the large number of amorphous photovoltaic cells 1 as illustrated in FIGS. 5(a) and 5(b).

An amorphous photovoltaic-cell module illustrated, by way of example, in FIG. 6 consists of the amorphous photovoltaic cells 1 in four columns and twelve rows, totaling forty-eight cells. The amorphous photovoltaic cells 1 in the two righthand columns and those in the two lefthand columns are arrayed facing directions opposite to each other. Thin rectangular ribbons 6 called "tab leads" are used for connecting the collectors 5 and the parts 2a of the stainless steel substrates 2.

Next, the method of electrical connection among the forty-eight photovoltaic cells in FIG. 6 will be explained. In forming the amorphous photovoltaic cell 1, the stainless steel substrate 2 has its parts 2a shielded by a mask (not shown) in advance so as to prevent the PIN-junction diode and the transparent upper electrode from being formed thereon. Accordingly, the parts 2a of the stainless steel substrate 2 and the collectors 5 have opposite polarities.

In the module of the amorphous photovoltaic cells for power generation thus constructed, the amorphous photovoltaic cells 1 at the heads of the two righthand columns or the two lefthand columns are connected in parallel by the ribbons 6, and the amorphous photovoltaic cells 1 of mutually opposite polarities adjoining in the vertical direction are successively connected in series as depicted in FIG. 6. Among the four amorphous photovoltaic cells 1 at the lowermost end, the two located centrally or the two located on both the outer sides are connected in series. Thus, two series paths are connected in parallel. Therefore, the amorphous photovoltaic-cell module is constructed so as to derive an electric output across the terminals thereof marked + and − when the surfaces of the cells are irradiated with light such as sunlight.

Unlike a single-crystal cell or a polycrystalline cell, the amorphous photovoltaic cell can advantageously be produced into as a large area element by, for example, the plasma CVD process. Since, however, an amorphous photovoltaic cell is a constructed from a thin-film, a large area cell cannot be made to have a large current flow therethrough. For this reason, metal substrate type amorphous photovoltaic cells and the module of the cells in the prior art are constructed as described above, and a large number of amorphous photovoltaic cells must be arrayed and connected by the ribbons. This has incurred the problem that much labor and time are expended in assembling the amorphous photovoltaic-cell module.

SUMMARY OF THE INVENTION

This invention has been made in order to solve the above problems, and has for its object the provision of a method of manufacturing an amorphous photovoltaic-cell module which is suited to automation and mass production by lessening the number of locations of electrical connection among the amorphous photovoltaic cells.

The method of manufacturing an amorphous photovoltaic-cell module according to this invention comprises the steps of forming an amorphous film on an elongate lower electrode except for narrow portions on both sides thereof, subsequently forming a film of a transparent upper electrode on said amorphous film and thereafter forming a large number of digitated collectors on said transparent upper electrode, thereby to prepare a unitary amorphous photovoltaic cell, the step of cutting said unitary amorphous photovoltaic cell into predetermined geometries and dimensions, and the step of electrically connecting in series the collector of each individual amorphous photovoltaic cell defined in the previous cutting step and the exposed narrow parts of said lower electrode of the adjacent individual amorphous photovoltaic cell.

In this invention, amorphous photovoltaic cells of great width and large area can be electrically connected by a very simple expedient, so that the labor required for the arrayal and connection of the amorphous photovoltaic cells decreases sharply. In addition, the effective area of the amorphous photovoltaic cell increases, so that an amorphous photovoltaic-cell module of high photoelectric efficiency can be manufactured.

BRIEF DESCRIPTION OF THE DRAWINGS

FIGS. 1(a) and 1(b) are a front view and a sectional view of a unitary amorphous photovoltaic cell in an embodiment of this invention, respectively, while

FIGS. 3(a) and 3(b) are a front view and a sectional view of a unitary amorphous photovoltaic cell in another embodiment of this invention, respectively, while FIGS. 5(a) and 5(b) are a front view and a sectional view of a prior art amorphous photovoltaic cell, respectively, while

DESCRIPTION OF THE PREFERRED EMBODIMENTS

Figure 1A:
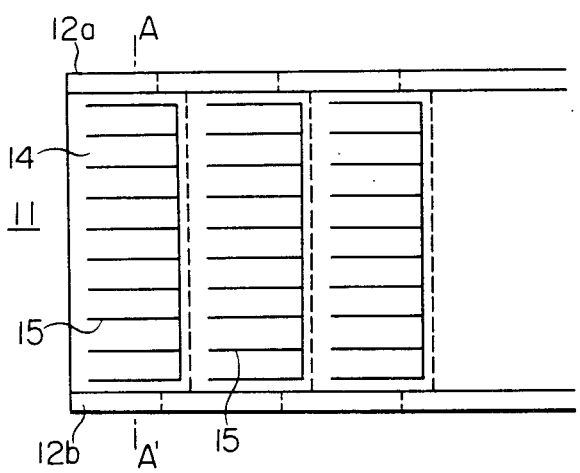
Figure 1B:
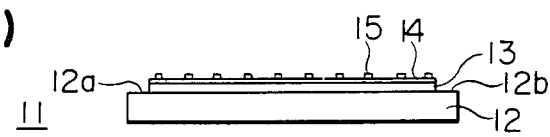

Now, an embodiment of this invention will be described with reference to FIGS. 1(a) and 1(b) and FIGS. 2(a) and 2(b). FIG. 1(a) is a front view of a unitary amorphous photovoltaic cell prepared on an elongate stainless steel substrate on the basis of this invention, while FIG. 1(b) is a sectional view taken along line A-A' in FIG. 1(a). The unitary amorphous photovoltaic cell 11 in FIGS. 1(a) and 1(b) is fabricated in such a way that an amorphous film 13 having a PIN-junction diode is first formed by a plasma CVD method on a broad elongate lower electrode 12 having a thickness of, e.g., 0.1 mm except for narrow portions 12a and 12b on both sides thereof, the film of a transparent upper electrode 14 is then formed on the amorphous film 13 by a sputtering method, and lastly, a large number of digitated collectors 15 are formed on the transparent upper electrode 14 by printing. The elongate lower electrode 12 is constructed of a metal substrate, for example a stainless steel substrate in the embodiment, and only the narrow portions 12a and 12b thereof are illustrated in FIG. 1(a). In addition, since the PIN-junction amorphous film 13 exits between the elongate lower electrode 12 and the transparent electrode 14, it is not shown in FIG. 1(a). Further, the large number of digitated collectors 15 are successively printed on the elongate lower electrode 12 with the same pattern in the lengthwise direction of the elongate lower electrode 12 and at predetermined intervals as illustrated in the figures.

Figure 2A:
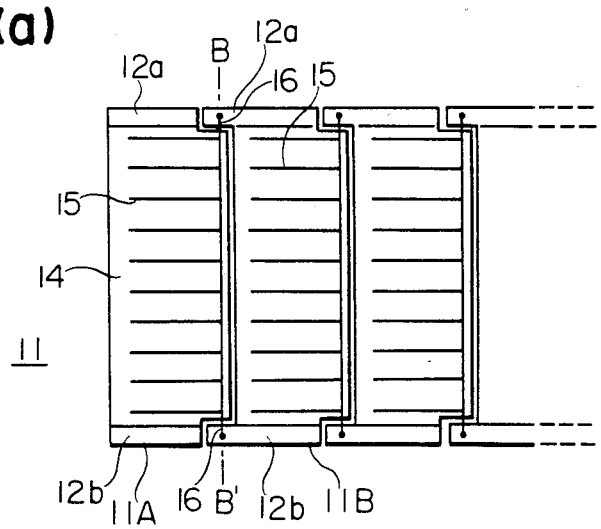
FIGS. 2(a) and 2(b) are a front view and a sectional view showing the construction of an amorphous photovoltaic-cell module in an embodiment of this invention, respectively.
Figure 2B:
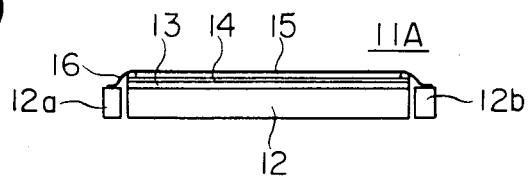

FIG. 2(a) is a front view showing an amorphous photovoltaic-cell module in an embodiment of this invention, while FIG. 2(b) is a sectional view taken along line B-B' in FIG. 2(a). The cell modules are manufactured from the unitary amorphous photovoltaic cell 11 shown in FIGS. 1(a) and 1(b). The unitary cell is cut by a laser beam into geometries indicated by dotted lines in FIG. 1(a), the cut individual amorphous photovoltaic cells being nested and arrayed in succession. The digitated collector 15 on the central portion of one individual amorphous photovoltaic cell, (for example, 11A), and the opposite end portions of the exposed narrow parts 12a, 12b of the lower electrode 12 of the adjacent individual amorphous photovoltaic cell (for example, 11B) are electrically connected in series by ribbons 16 which are arranged in the crosswise direction of the elongate lower electrode requiring short, straight connection to electrically join the adjacent cells.

In the unitary amorphous photovoltaic cell 11 constructed as shown in FIGS. 1(a) and 1(b), the elongate lower electrode 12 has a polarity opposite to that of the digitated collector 15. In the amorphous photovoltaic-cell module constructed as shown in FIGS. 2(a) and 2(b), the digitated collector 15 of one individual amorphous photovoltaic cell and the narrow parts 12a, 12b of the lower electrode 12 of the adjacent individual cell are connected by the ribbons 16. Consequently, the digitated collectors and the narrow parts of the lower electrodes are electrically connected in succession by an expedient suited to automation and mass production, for example, solder connections, electric discharge welding such as spot welding, or the printing of the ribbons, whereby the series connection between the individual amorphous photovoltaic cells can be readily effected.

Figure 3A:
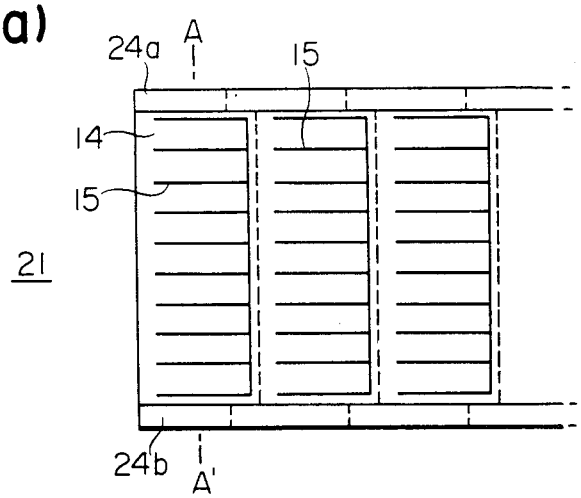
Figure 3B:
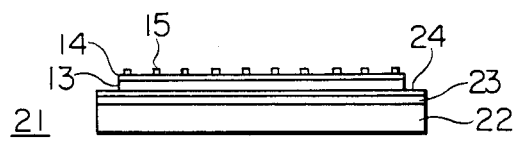

Next, another embodiment of this invention will be described with reference to FIGS. 3(a) and 3(b) and FIGS. 4(a) and 4(b). FIG. 3(a) is a front view of a unitary amorphous photovoltaic cell prepared on an elongate stainless steel substrate on the basis of this invention, while FIG. 3(b) is a sectional view taken along line A-A' in FIG. 3(a). The unitary amorphous photovoltaic cell 21 in FIGS. 3(a) and 3(b) is fabricated as follows: On an inexpensive elongate inorganic substrate, for example, the elongate rolled stainless steel substrate 22 0.1 mm thick similar to that of the lower electrode 12 in FIGS. 1(a) and 1(b), an elongate insulator film 23 which is flexible and refractory, for example, a polyimide insulative film which is 20 $\mu$m thick, is formed by coating and subsequent heat hardening. Subsequently, a silver electrode as an elongate lower electrode 24 is vapor deposited by a sputtering method. Thereafter, an amorphous film 13 having a PIN-junction, for example, an amorphous silicon film, is formed by a plasma CVD method as in the case of FIGS. 1(a) and 1(b). Further, the film of a transparent upper electrode 14 of for example, indium oxide or tin oxide, is again formed using a sputtering method. Lastly, a large number of digitated collectors 15 are formed on the transparent upper electrode film 14 by printing a silver paste thereon and then heat-hardening it.

Figure 4A:
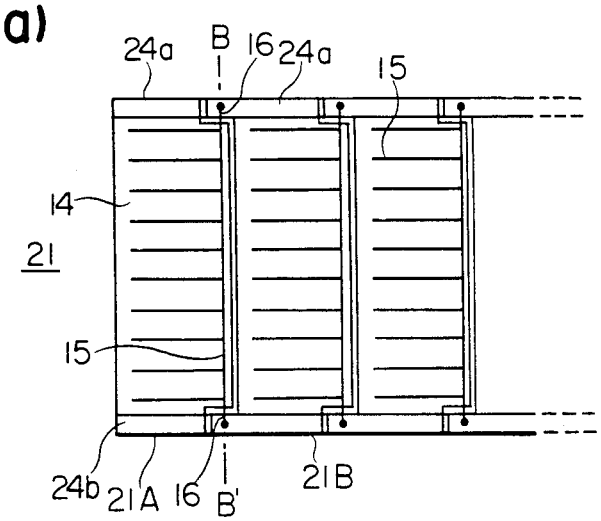
FIGS. 4(a) and 4(b) are a front view and a sectional view showing the construction of an amorphous photovoltaic-cell module in another embodiment of this invention, respectively.
Figure 4B:
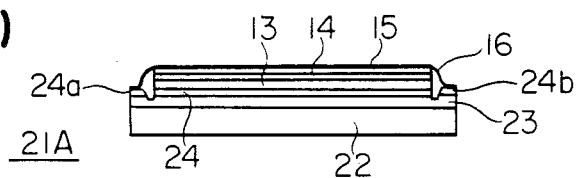
Figure 5A:
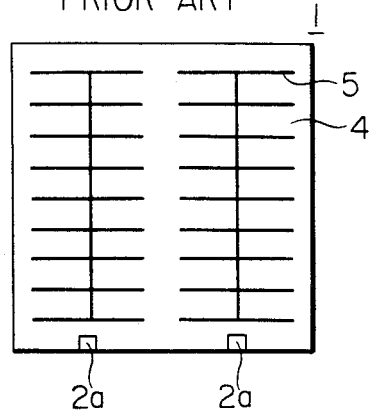
Figure 5B:
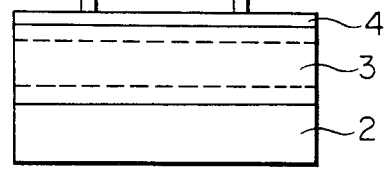
Figure 6:
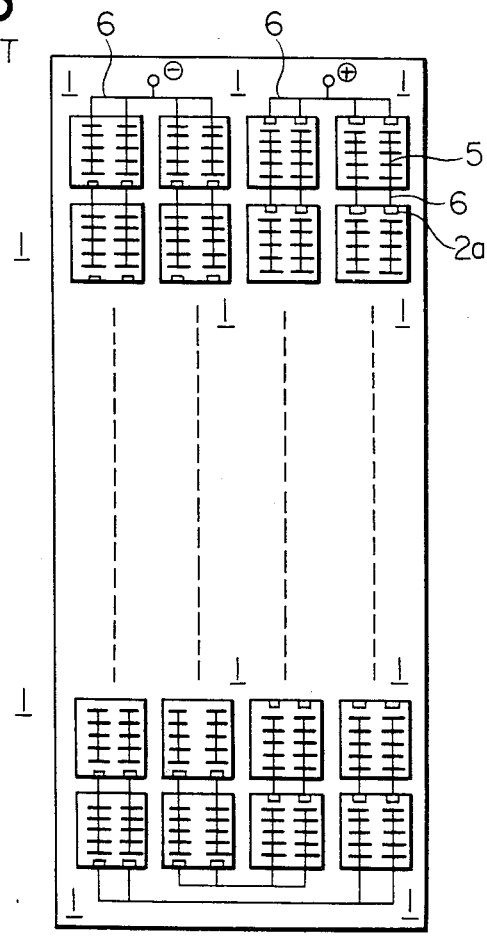
FIG. 6 is a front view showing the construction of an amorphous photovoltaic-cell module in the prior art.

FIG. 4(a) is a front view showing an amorphous photovoltaic-cell module in the other embodiment of this invention, while FIG. 4(b) is a sectional view taken along line B-B' in FIG. 4(a). The cell module is such that the unitary amorphous photovoltaic cell 21 constructed as shown in FIGS. 3(a) and 3(b) is cut by a laser beam into geometries indicated by the dotted lines in FIG. 3(a) down to the elongate insulative film 23 in FIG. 3(b), whereupon the digitated collector 15 of one individual amorphous photovoltaic cell, for example, 21A and the exposed narrow parts 24a, 24b of the lower electrode 24 of the adjacent individual amorphous photovoltaic cell 21B are electrically connected in series by ribbons 16.

Although, in the second embodiment thus far described, an elongate stainless steel substrate has been employed, the material of the substrate may be either organic or inorganic. Besides, although a polyimide film has been employed as the elongate insulative film, an inorganic insulative film of glass or the like can also be used for the same purpose. Further, the individual amorphous photovoltaic cells can be connected, not only by solder connections, but also by the printing or vapor deposition of conductive material or by electric discharge welding such as spot welding. Moreover, the amorphous photovoltaic-cell module of large area can be readily manufactured on the same substrate by a method suited to automation and mass production.

As stated above, according to this invention, the portions of a unitary amorphous photovoltaic cell formed on an elongate lower electrode are cut into predetermined geometries, and the individual amorphous photovoltaic cells cut out are arrayed with their positional order left intact and are connected in series with the adjacent individual cells, thereby to construct an amorphous photovoltaic-cell module. The invention therefore enables modules based on amorphous photovoltaic cells of large area to be manufactured easily, promptly and inexpensively by a method suited to automation and mass production.

What is claimed is:

1. A method of manufacturing an amorphous photovoltaic-cell module, said method comprising the step of preparing an elongated unitary amorphous photovoltaic cell by first forming an amorphous film having a PIN-junction on an elongate lower electrode except for narrow parts on both longitudinally extending sides thereof which provide exposed narrow lower electrode parts, subsequently forming a film of a transparent upper electrode on the amorphous film, and thereafter forming a large number of spaced apart digitated current collectors on the transparent upper electrode successively in the lengthwise direction of the elongate lower electrode at predetermined intervals, the step of cutting the elongated unitary amorphous photovoltaic cell into shorter sections, each said section including at least one of the large number of digitated collectors, to form a succession of individual amorphous photovoltaic cells, each having a central portion carrying at least one of the current collectors nested between opposite end portions of the exposed narrow parts of the lower electrode of an adjacent cell, and the step of connecting adjacent cells in electrical series by connecting in the crosswise direction of the lower electrode both exposed narrow parts of each individual cell and the current collector on the central portion of an adjacent cell nested therebetween.

2. A method of manufacturing an amorphous photovoltaic-cell module as defined in claim 1 wherein said step of connecting electrical series is performed by soldering, vapor deposition, printing, or electric discharge welding.

3. A method of manufacturing an amorphous photovoltaic-cell module as defined in claim 1 wherein the elongate lower electrode is a stainless steel substrate.

4. A method of manufacturing an amorphous photovoltaic-cell module as defined in claim 1 wherein the lower electrode is a conductive electrode film which is formed on an elongate insulative film formed on an elongate inorganic or organic substrate, said insulative film being flexible and refractory.

5. A method of manufacturing an amorphous photovoltaic-cell module as defined in claim 1 wherein said step of connecting in electrical series is performed using short, straight, parallel connections to electrically join the adjacent cells.

6. A method of manufacturing an amorphous photovoltaic-cell module comprising:
preparing a unitary amorphous photovoltaic cell including exposing narrow parts along both opposing sides of a lower electrode;
dividing the unitary amorphous photovoltaic cell into at least first and second adjacent individual amorphous photovoltaic cells including forming a central portion of the first individual amorphous photovoltaic cell nested between the exposed narrow parts of the second individual amorphous photovoltaic cell; and
connecting the first and second individual amorphous photovoltaic cells by forming a connection across a digitated collector of the central portion of the first individual amorphous photovoltaic cell between the exposed narrow parts of the second individual amorphous photovoltaic cell.

7. The method as defined in claim 6 wherein exposing the narrow parts includes exposing the narrow parts of the lower electrode along the entire length of the unitary amorphous photovoltaic cell.

8. The method as defined in claim 6 wherein dividing the unitary amorphous photovoltaic cell comprises cutting the unitary amorphous photovoltaic cell.

9. The method as defined in claim 8 wherein preparing the unitary amorphous photovoltaic cell further includes providing a substrate under the lower electrode and wherein cutting the unitary amorphous photovoltaic cell further includes not cutting through the substrate.

* * * * *